US009235285B2

(12) United States Patent
Hu

(10) Patent No.: US 9,235,285 B2
(45) Date of Patent: Jan. 12, 2016

(54) PIXEL MATRIX, TOUCH DISPLAY DEVICE AND DRVING METHOD THEREOF

(71) Applicant: HIMAX TECHNOLOGIES LIMITED, Tainan (TW)

(72) Inventor: Chia-Wei Hu, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 140 days.

(21) Appl. No.: 14/025,445

(22) Filed: Sep. 12, 2013

(65) Prior Publication Data
US 2014/0333571 A1 Nov. 13, 2014

Related U.S. Application Data

(60) Provisional application No. 61/822,894, filed on May 13, 2013.

(51) Int. Cl.
G06F 3/044 (2006.01)
G06F 3/041 (2006.01)
H01L 27/12 (2006.01)

(52) U.S. Cl.
CPC .............. G06F 3/0412 (2013.01); G06F 3/044 (2013.01); G06F 3/0418 (2013.01); H01L 27/124 (2013.01)

(58) Field of Classification Search
CPC ......................................... G06F 3/041–3/04897
See application file for complete search history.

(56) References Cited

U.S. PATENT DOCUMENTS

| 2008/0180371 A1* | 7/2008 | Shie ................................ 345/87 |
| 2009/0096760 A1 | 4/2009 | Ma et al. | |
| 2012/0105381 A1* | 5/2012 | Lee ...................... G06F 3/0412 345/176 |
| 2012/0105752 A1* | 5/2012 | Park .................... G02F 1/13338 349/33 |
| 2012/0113339 A1* | 5/2012 | Park ........................ G06F 3/044 349/33 |
| 2012/0133858 A1* | 5/2012 | Shin ..................... G02F 1/13338 349/59 |
| 2012/0218482 A1* | 8/2012 | Hwang ................... G06F 3/044 349/12 |
| 2013/0044074 A1* | 2/2013 | Park .................... G02F 1/13338 345/174 |
| 2013/0082954 A1* | 4/2013 | Azumi et al. .................. 345/173 |
| 2013/0314360 A1* | 11/2013 | Saitoh et al. .................. 345/173 |
| 2014/0071066 A1* | 3/2014 | Lee ....................... G06F 3/0416 345/173 |

(Continued)

FOREIGN PATENT DOCUMENTS

JP 04-051121 2/1992
JP 09-015642 1/1997

(Continued)

OTHER PUBLICATIONS

"Office Action of Japan Counterpart Application", issued on Jan. 6, 2015, p. 1-p. 4.

(Continued)

Primary Examiner — Gene W Lee
(74) Attorney, Agent, or Firm — J.C. Patents

(57) ABSTRACT

A pixel matrix including a first substrate, a plurality of pixel structures, a first electrode set and a common electrode is provided. The pixel structures are disposed on the first substrate in an array arrangement. Each of the pixel structures includes a pixel electrode. The first electrode set includes a plurality of first electrodes arranged along a first direction on the first substrate. Each of the first electrodes having a plurality of first openings arranged corresponding to the pixel electrodes and surrounding the corresponding pixel electrodes. The common electrode is disposed between the first electrodes and the first substrate and between the pixel electrode and the first substrate. A touch display device having the pixel matrix and the driving method thereof are also provided.

19 Claims, 6 Drawing Sheets

(56) References Cited

U.S. PATENT DOCUMENTS

| | | | | |
|---|---|---|---|---|
| 2014/0118299 A1* | 5/2014 | Wang | G06F 3/0416 | 345/174 |
| 2014/0168537 A1* | 6/2014 | Han | G06F 3/0412 | 349/12 |
| 2014/0184533 A1* | 7/2014 | Park | G06F 3/0412 | 345/173 |
| 2014/0306916 A1* | 10/2014 | Wang | G06F 3/041 | 345/173 |
| 2014/0327840 A1* | 11/2014 | Kim | G06F 3/044 | 349/12 |
| 2015/0022500 A1* | 1/2015 | Kita et al. | | 345/174 |
| 2015/0022501 A1* | 1/2015 | Kita | G02F 1/13338 | 345/174 |

FOREIGN PATENT DOCUMENTS

| | | |
|---|---|---|
| JP | 2002-174828 | 6/2002 |
| JP | 2008112907 | 5/2008 |
| JP | 2008-185785 | 8/2008 |
| JP | 2008191665 | 8/2008 |
| JP | 2009-229854 | 10/2009 |
| JP | 2010237333 | 10/2010 |
| JP | 2011-014109 | 1/2011 |
| JP | 2013242432 | 12/2013 |
| TW | I247943 | 1/2006 |
| TW | I282621 | 6/2007 |
| TW | I366726 | 6/2012 |
| WO | 2010098199 | 9/2010 |

OTHER PUBLICATIONS

"Office Action of Japan Counterpart Application", issued on Jun. 30, 2015, p. 1-p. 6.

"Office Action of Taiwan Counterpart Application", issued on Jun. 15, 2015, p. 1-p. 4.

* cited by examiner

PIXEL MATRIX, TOUCH DISPLAY DEVICE AND DRVING METHOD THEREOF

CROSS-REFERENCE TO RELATED APPLICATION

This application claims the priority benefits of U.S. provisional application Ser. No. 61/822,894, filed on May 13, 2013. The entirety of the above-mentioned patent applications is hereby incorporated by reference herein and made a part of this specification.

BACKGROUND OF THE INVENTION

1. Field of the Invention

The invention generally relates to a pixel matrix, display device and a driving method. More particularly, the invention relates to a pixel matrix, touch display device and a driving method thereof.

2. Description of Related Art

A display apparatus having a touch-sensing function is generally implemented by a touch system and a display system independent to each other. System integration and cost reduction are unchanged developing trends of electronics industry. With progress of fabrication techniques, a touch panels is now successfully integrated with a display panel, so that a user can direct an electronic device to perform required operations through touch operations. Generally, sensing units on the touch panel and pixel units on the display panel are all arranged on a two-dimensional plane in matrices, and timings for updating frames and detecting touch points are determined according scan signals.

Generally, the touch panel has to detect an electrical difference between a touch operation and a non-touch situation. The electrical difference is generally very small, so that noise interference has to be prevented. However, when the display panel is driven, scan signals, data signals and a common electrode signal are transmitted, and when these signals are varied, the touch panel is influenced. Under a developing trend that the touch panel is integrated with the display panel, interference therebetween becomes more serious.

SUMMARY OF THE INVENTION

Accordingly, the invention is directed to a pixel matrix, a touch display device and a driving method which are capable of improving the display quality and the touch sensibility.

An embodiment of the invention provides a pixel matrix including a first substrate, a plurality of pixel structures, a first electrode set and a common electrode. The pixel structures are disposed on the first substrate in an array arrangement. Each of the pixel structures includes a pixel electrode. The first electrode set includes a plurality of first electrodes arranged along a first direction on the first substrate. Each of the first electrodes having a plurality of first openings arranged corresponding to the pixel electrodes and surrounding the corresponding pixel electrodes. The common electrode is disposed between the first electrodes and the first substrate and between the pixel electrode and the first substrate.

An embodiment of the invention provides a touch display device including a touch display panel, a driving module, a sensing module and a control unit. The touch display panel includes a first substrate, a plurality of pixel structures, a first electrode set, a common electrode, a second substrate, a second electrode set and a display medium. The pixel structures are disposed on the first substrate in an array arrangement. Each of the pixel structures includes a pixel electrode. The first electrode set includes a plurality of first electrodes arranged along a first direction on the first substrate. The first electrodes are configured to separate any two adjacent pixel electrodes from each other. The common electrode is disposed between the first electrodes and the first substrate. The second substrate is disposed opposite to the first substrate and has a top surface and a bottom surface opposite to the top surface, wherein the bottom surface faces the first substrate. The second electrode set includes a plurality of second electrodes disposed on the top surface of the second substrate and arranged along a second direction intersected with the first direction. The display medium is sandwiched between the first substrate and the second substrate. The driving module is coupled to the touch display panel and configured to provide a plurality of pixel voltages to the pixel electrodes during a display driving period in a frame period, and provide a plurality of sensing voltages to one of the first electrode set and second electrode set during a touch sensing period in the frame period. The sensing module is coupled to the touch display panel to receive signals from the other one of the first electrode set and second electrode set. The control unit is coupled to the driving module and the sensing module.

An embodiment of the invention provides a driving method for a touch display panel. The driving method includes the following steps. A plurality of pixel voltages are provided to a plurality of pixel electrodes of the touch display panel during a display driving period in a frame period, wherein the touch display panel includes a first substrate, a second substrate opposite to the first substrate, a first electrode set disposed on the first substrate and a second electrode set disposed on a top surface of the second substrate. The first electrode set is configured to separate any two adjacent pixel electrodes from each other. One of first electrode set and the second electrode set are driven during a touch sensing period in the frame period. A plurality of sensing signals are received from the other one of the first electrode set and second electrode set during the touch sensing period.

Based on the above description, the first electrodes of the invention are configured to separate any two adjacent pixel electrodes from each other, such that the first electrodes shield the pixel electrodes from each other to reduce the coupling effect therebetween during the display driving period. In addition, a plurality of sensing voltages are provided to the first electrodes, such that the first electrodes function as touch sensing electrodes during the touch sensing period. Thereby, the touch sensing electrodes are built in the pixel matrix of the invention, which effectively reduces overall thickness of the touch display device. Moreover, since the signal interference between the pixel electrodes are shielded by the first electrodes, the required gap between any two adjacent pixel electrodes can be reduced so as to improve the aperture ratio and provide better display quality.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
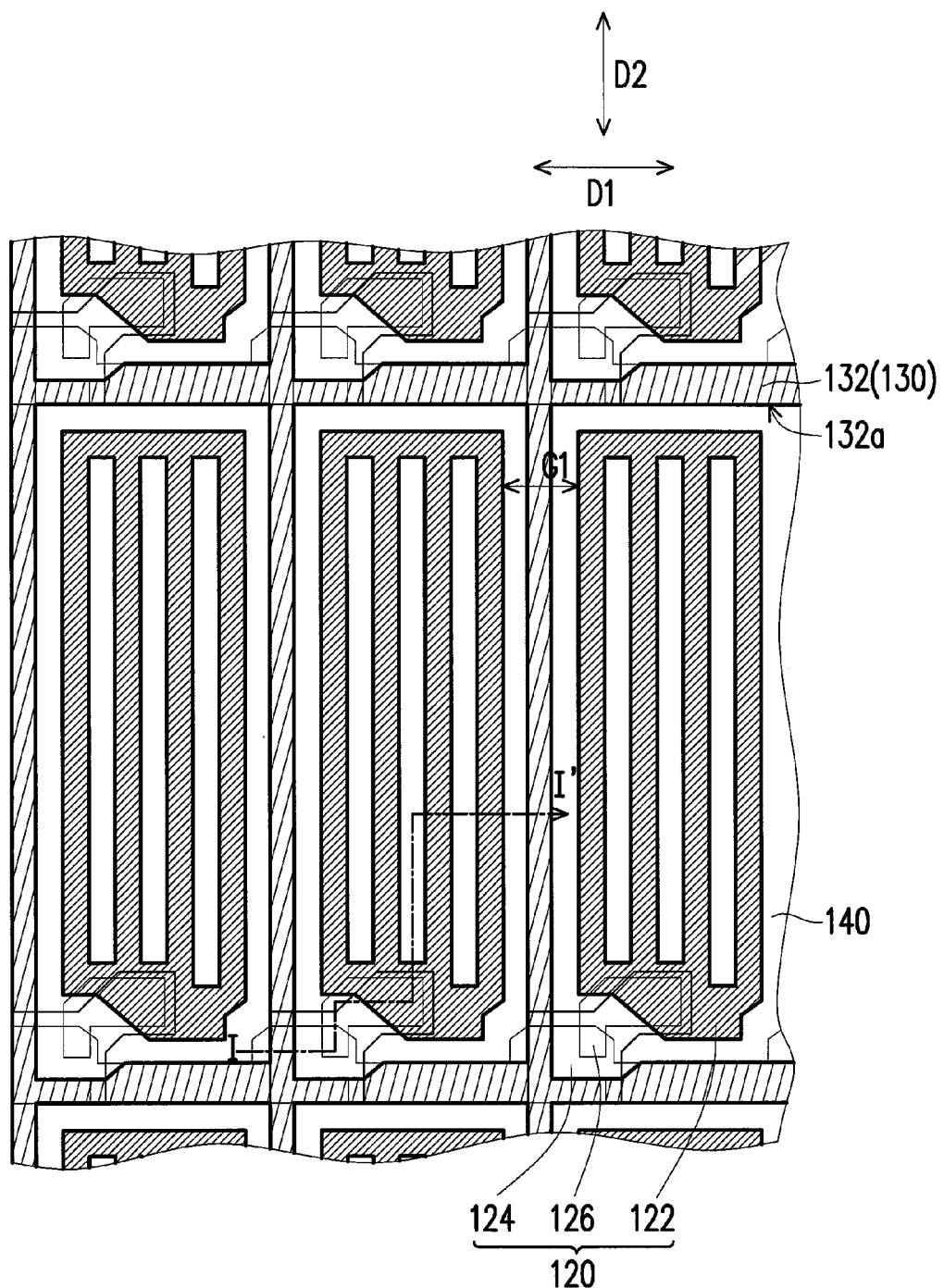
FIG. 1 illustrates a schematic top view of a pixel matrix according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
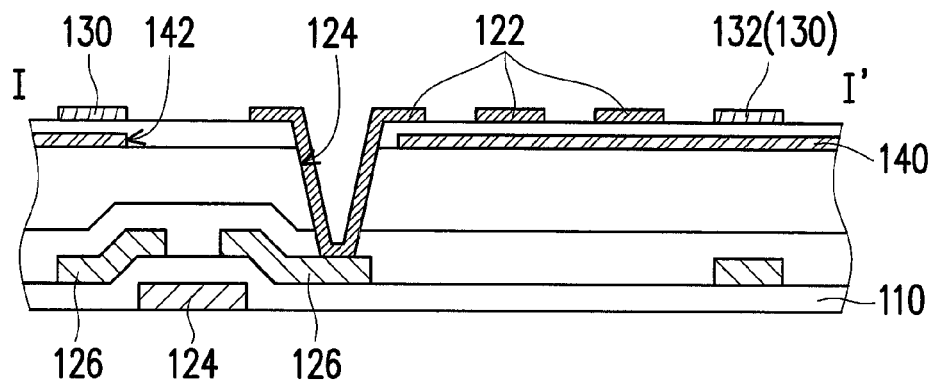
FIG. 2 illustrates a cross-sectional view of the pixel matrix in FIG. 1 along section line I-I'.

FIG. 1 illustrates a schematic top view of a pixel matrix according to an embodiment of the invention. FIG. 2 illustrates a cross-sectional view of the pixel matrix in FIG. 1 along section line I-I'. In the present embodiment, the pixel matrix as shown in FIG. 1 and FIG. 2 includes a first substrate 110, a plurality of pixel structures 120, a first electrode set 130 and a common electrode 140. The pixel structures 120 include a plurality of pixel electrodes 122 and are disposed on the first substrate 110 in an array arrangement. In detail, the pixel structures 120 further include a plurality of active devices (not shown), a plurality of scan lines 124 and a plurality of data lines 126. The active devices are in an on state during a display driving period in a frame period, and in an off state during a touch sensing period in the frame period. Each of the active devices is coupled to one of the scan lines 124 and one of the data lines 126. The scan lines 124 and the data lines 126 are disposed on the first substrate 110, wherein each of the data lines 126 crosses over all the scan lines 124.

Moreover, the first electrode set 130 includes a plurality of first electrodes 132 arranged on the first substrate 110 along, for example, a first direction D1 as shown in FIG. 1. It is noted that only a partial view of a first electrode 132 is shown in FIG. 1 for illustration purpose. Each of the first electrodes 132 has a plurality of first openings 132a arranged corresponding to the pixel electrodes 122 and surrounding the corresponding pixel electrodes 122, such that the first electrodes 132 are configured to separate any two adjacent pixel electrodes 122 from each other. The first electrodes 132 may shield the pixel electrodes 122 from each other so as to reduce the coupling effect between any two adjacent pixel electrodes 122 during the display driving period. Since the signal interference between the pixel electrodes 122 are reduced, the required gap G1 between the adjacent pixel electrodes 122 are also reduced, so as to improve the aperture ratio of the pixel matrix. In this embodiment, the active devices are thin film transistors (TFTs), and the pixel matrix is a TFT substrate.

In addition, the first electrodes 132 may also be the transmitters for touch sensing purpose during the touch sensing period. That is, a plurality of sensing voltages are respectively provided to the first electrodes 132 by turns. Of course, in other embodiment, the first electrodes 132 may also be the receivers for touch sensing purpose during the touch sensing period. In general, the transmitter is an electrode transmitting a touch sensing signal, and the receiver is an electrode sensing the touch sensing signal. Moreover, the common electrode 140, as shown in FIG. 2, includes a plurality of second openings 142 and each of the pixel electrodes 122 are electrically connected to the corresponding data line 126 through a first via 124 penetrating through the corresponding second opening 142.

Figure 7:
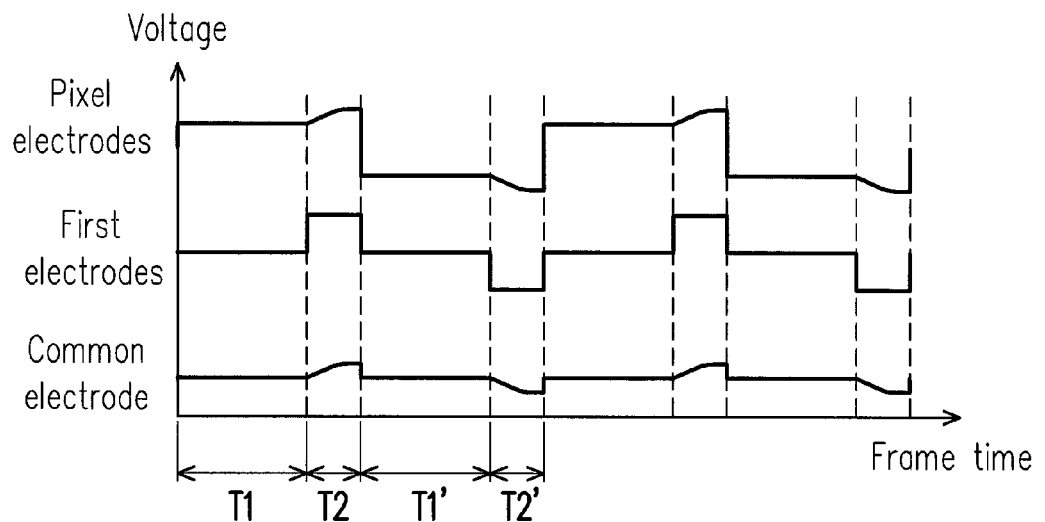
FIG. 7 to FIG. 10 illustrate different driving methods of a touch display device according to different embodiments of the present invention.

FIG. 7 illustrates a driving method of a touch display device having the pixel matrix in FIG. 2. Referring to both FIG. 2 and FIG. 7, the common electrode 140 is disposed between the first electrodes 132 and the first substrate 110 and also between the pixel electrode 122 and the first substrate 110. Accordingly, the common electrode 140 may shield the first electrodes 132 from the scan lines 124 and the data lines 126 to reduce the signal interference during the touch sensing period T2, so as to improve the touch sensibility. Referring to FIG. 7, a plurality of pixel voltages are provided to the pixel electrodes 122 and a reference voltage may be provided to the common electrode 140 during the display driving period T1. In the present embodiment, the first electrodes 132 function as the transmitters during the touch sensing period T2, therefore, the sensing voltages are respectively provided to the first electrodes 132 by turns. The pixel electrodes 122 and the common electrode 140 are coupled to the first electrodes 132 during the touch sensing period T2.

Figure 8:
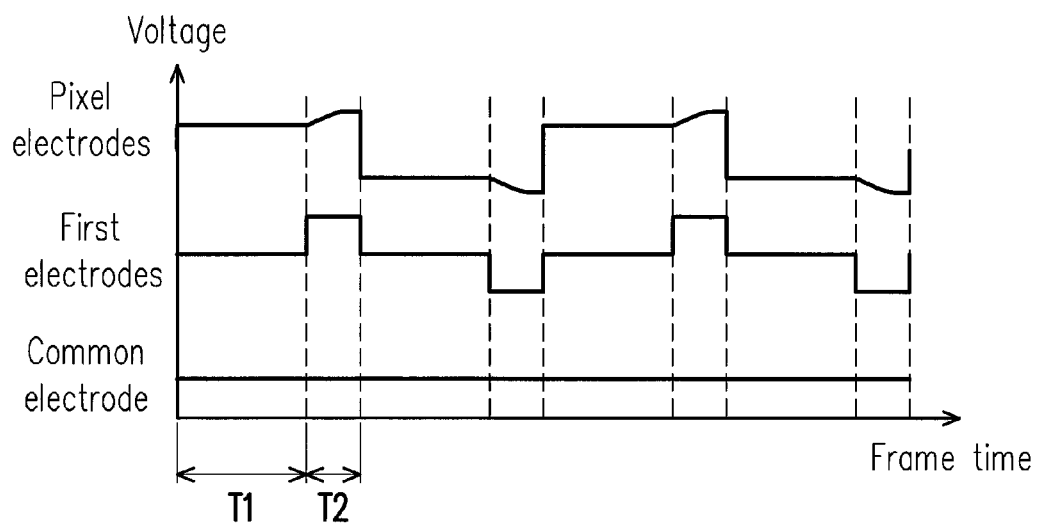

FIG. 8 illustrates a different driving method of a touch display device having the pixel matrix in FIG. 2. Referring to both FIG. 2 and FIG. 8, in the present embodiment, a reference voltage may be provided to the common electrode 140 constantly as shown in FIG. 8, and the pixel voltages are provided to the pixel electrodes 122 during the display driving period T1. In the present embodiment, the first electrodes 132 function as the transmitters during the touch sensing period T2, therefore, the sensing voltages are respectively provided to the first electrodes 132 by turns, and the pixel electrodes 122 are coupled to the first electrodes 132 during the touch sensing period T2.

Figure 3:
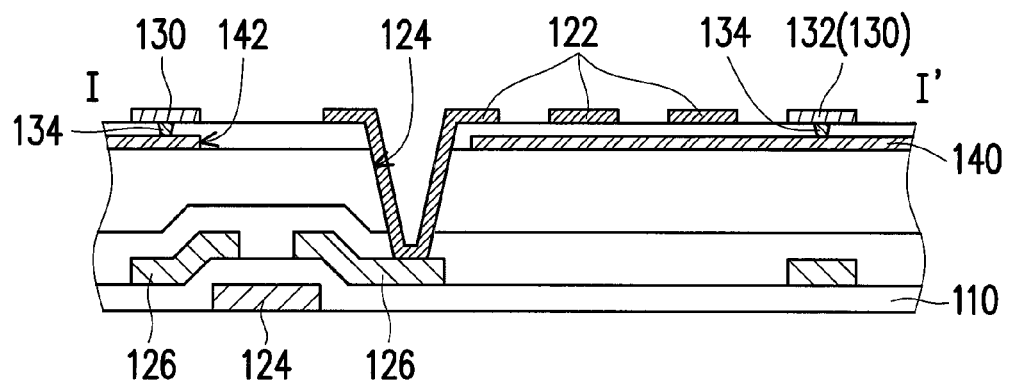
FIG. 3 illustrates a cross-sectional view of a pixel matrix according to another embodiment of the invention.
Figure 9:
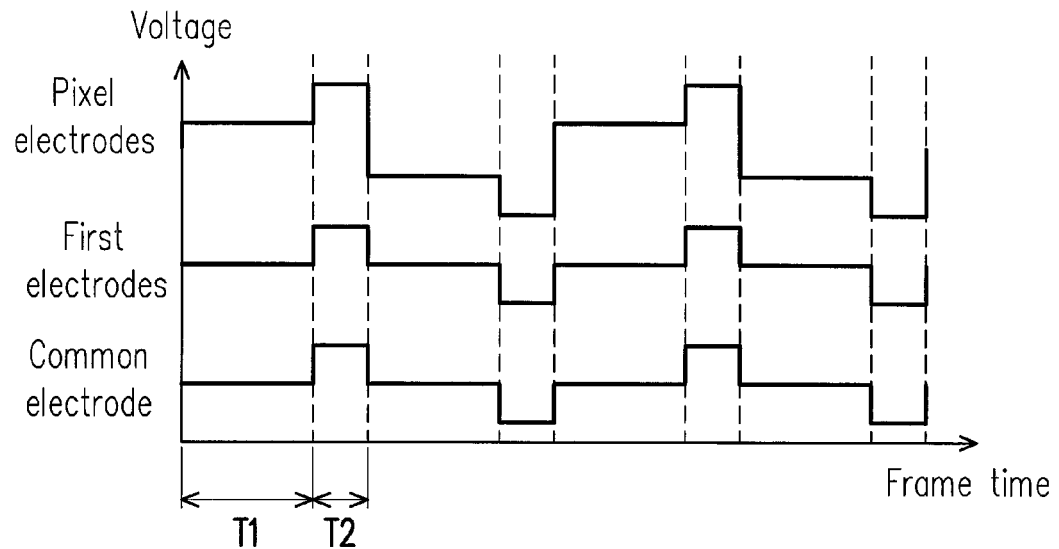

FIG. 3 illustrates a cross-sectional view of a pixel matrix according to another embodiment of the invention. FIG. 9 illustrates a driving method of a touch display device having the pixel matrix in FIG. 3. It is noted that the pixel matrix shown in FIG. 3 contains many features same as or similar to the pixel matrix disclosed earlier with FIG. 1 and FIG. 2. For purpose of clarity and simplicity, detail description of same or similar features may be omitted. The main differences between the pixel matrix shown in FIG. 3 and the pixel matrix shown in FIG. 2 are that the pixel matrix in FIG. 3 further includes a plurality of second vias 132. The second vias 132 are disposed between the first electrodes 132 and the common electrode 140 for electrically connecting the first electrodes 132 to the common electrode 140 respectively. In the present embodiment, the first electrodes 132 function as the transmitters during the touch sensing period T2. Therefore, the sensing voltages are provided to both the first electrodes 132 and the common electrode 140 during the touch sensing period T2 as shown in FIG. 9, and the pixel voltages are provided to the pixel electrodes 122 during the display driving period T1.

Figure 4:
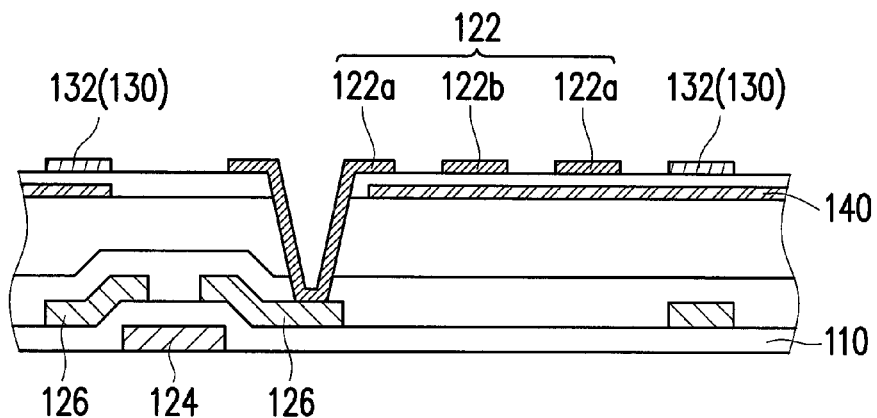
FIG. 4 illustrates a cross-sectional view of a pixel matrix according to another embodiment of the invention.
Figure 10:
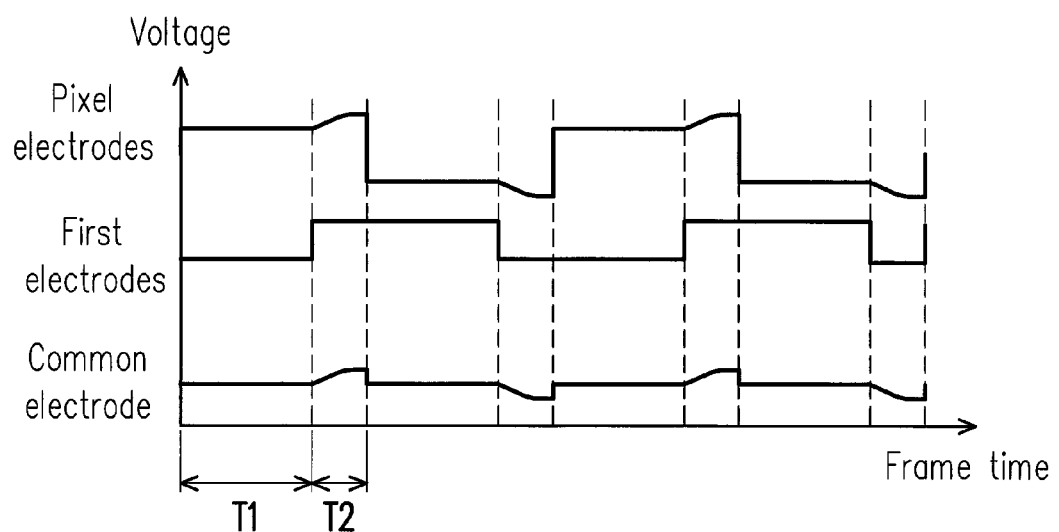

FIG. 4 illustrates a cross-sectional view of a pixel matrix according to another embodiment of the invention. FIG. 10 illustrates a driving method of a touch display device having the pixel matrix in FIG. 4. It is noted that the pixel matrix shown in FIG. 4 contains many features same as or similar to the pixel matrix disclosed earlier with FIG. 1 and FIG. 2. For purpose of clarity and simplicity, detail description of same or similar features may be omitted. Referring to both FIG. 4 and FIG. 10, the main differences between the pixel matrix shown in FIG. 4 and the pixel matrix shown in FIG. 2 are that each of the pixel electrodes 122 shown in FIG. 4 includes a first pixel electrode 122a and a second pixel electrode 122b. In the present embodiment, the first electrodes 132 function as the transmitters during the touch sensing period T2. Therefore, the sensing voltages are provided to the first electrodes 132. Accordingly, referring to FIG. 10, a first voltage is provided to the first pixel electrode 122a during the display driving period T1, and a second voltage is provided to the second pixel electrode 122b, wherein the second voltage are the same as the sensing voltages provided to the first electrodes 132, and the first voltage is different from the second voltage, so as to create a in-plane switching (IPS) effect between the first pixel electrode 122a and the second pixel electrode 122b. In the present embodiment, the first voltage is opposite in polarity and same in absolute value as compared with the second voltage, but the invention is not limited thereto. In the present embodiment, the first pixel electrode 122a may be coupled to the second pixel electrode 122b and the first electrodes 132 during the touch sensing period T2.

Figure 5:
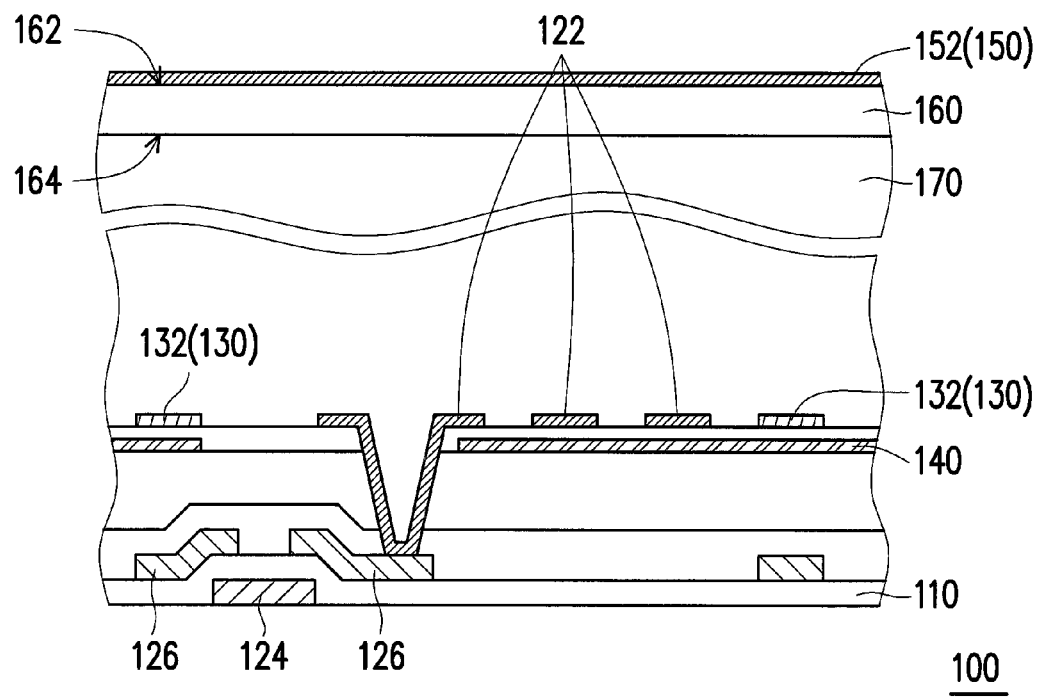
FIG. 5 illustrates a cross-sectional view of a touch display panel according to an embodiment of the present invention.
Figure 6:
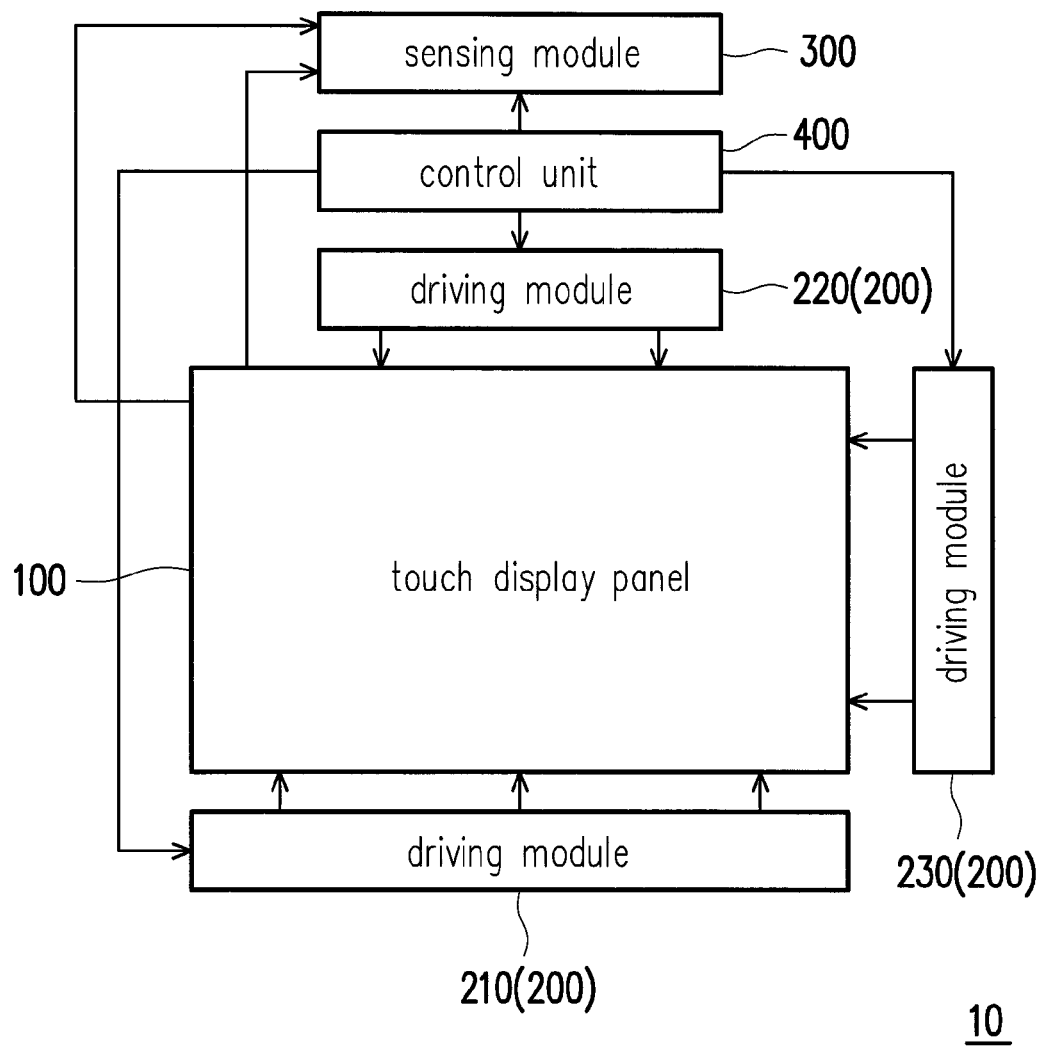
FIG. 6 illustrates a touch display device according to an embodiment of the present invention.

FIG. 5 illustrates a cross-sectional view of a touch display panel according to an embodiment of the present invention. FIG. 6 illustrates a touch display device according to an embodiment of the present invention. Referring to both FIG. 5 and FIG. 6, the touch display device 10 of the present embodiment includes a touch display panel 100, a driving module 200, a sensing module 300 and a control unit 400. In the present embodiment, the touch display panel 100 may include a second electrode set 150, a second substrate 160, a display medium 170 and any one of the pixel matrixes shown in FIG. 1 to FIG. 4. It is noted that the touch display panel 100 in FIG. 5 adopts the pixel matrix in FIG. 2, but, of course, the invention is not limited thereto. For purpose of clarity and simplicity, detail description of same or similar features may be omitted. Referring to FIG. 5, the second substrate 160 is disposed opposite to the first substrate 110 and has a top surface 162 and a bottom surface 164 opposite to the top surface 162, wherein the bottom surface 164 faces the first substrate 110. In the present embodiment, the second substrate 160 is, for example, a color filter substrate, and the second electrode set 150 may be an electrostatic discharge (ESD) protection layer disposed on the top surface 162 of the second substrate 160 to prevent the circuits of the touch display device 10 from being damaged by discharging electrostatic charges. The second electrode set 150 includes a plurality of second electrodes 152 disposed on the top surface 162 of the second substrate 160 and arranged along, for example, a second direction D2 shown in FIG. 1, which is intersected with the first direction D1. The display medium 170 is sandwiched between the first substrate 110 and the second substrate 160. In addition, the second electrode set 150 may also function as the touch sensing electrodes (transmitters or receivers) during the touch sensing period.

Accordingly, a driving method applicable for the touch display panel 100 described above is developed. The driving method includes the following steps: firstly, a plurality of pixel voltages are provided to the pixel electrodes 122 of the touch display panel 100 during a display driving period in a frame period. Next, one of the first electrode set 130 and the second electrode set 150 are driven during a touch sensing period in the frame period. Then, a plurality of sensing signals are received from the other one of the first electrode set 130 and second electrode set 150 during the touch sensing period.

To be more specific, Referring to FIG. 5 to FIG. 7, the driving module 200 is coupled to the touch display panel 100 and configured to provide the pixel voltages to the pixel electrodes 122 during the display driving period T1 in the frame period, and provide the sensing voltages to one of the first electrode set 130 and the second electrode set 150 during the touch sensing period T2 in the frame period. The driving module 200 may includes a plurality of drivers. In detail, the driving module 200 may includes a common electrode driver 210 coupled to the common electrode 140, a gate driver 220 coupled to the scan lines 124, and a source driver 230 coupled to the data lines 126, but, of course, the invention is not limited thereto. The sensing module 300 is coupled to the touch display panel 100 to receive the signals from the other one of the first electrode set 130 and the second electrode set 150.

In the present embodiment, the sensing voltages are provided to the first electrode set 130 during the touch sensing period T2, and the sensing module 300 receives the signals from the second electrode set 150. That is, the first electrodes 132 of the first electrode set 130 are the transmitters, and the second electrodes 152 of the second electrode set 150 are the receivers during the touch sensing period T2. Of course, in other embodiment, the second electrodes 152 may be the transmitters, and the first electrodes 132 may be the receivers during the touch sensing period T2, which means the sensing voltages are provided to the second electrode set 150, and causes the sensing module 300 to receive the signals from the first electrodes 132 during the touch sensing period T2.

In detail, the control unit 400 is coupled to the driving module 200 and the sensing module 300. As such, the control unit 400 causes the driving module 200 to provide the pixel voltages to the pixel electrodes 122 during the display driving period T1, and respectively provide the sensing voltages to the first electrodes 132 by turns during the touch sensing period T2 as shown in FIG. 7. The control unit 400 further causes the sensing module 300 to receive the signals from the second electrodes 152 during the touch sensing period T2. The pixel electrodes 122 are coupled to the first electrodes 132 during the touch sensing period T2. Also, the control unit 400 causes the driving module 200 to provide a reference voltage to the common electrode 140 during the display driving period T1, and causes the driving module 200 to stop providing the reference voltage to the common electrode 140 during the touch sensing period T2, such that the common electrode 140 is coupled to the first electrodes 132 during the touch sensing period T2.

Specifically, the control unit 400 causes the driving module 200 to respectively provide a plurality of first sensing voltages to the first electrodes 132 by turns during a first touch sensing period T2 in a first frame period and respectively provides a plurality of second sensing voltages to the first electrodes 132 by turns during a second touch sensing period T2' in a second frame period next to the first frame period. In the present embodiment, the second sensing voltages are opposite in polarity and same in absolute value as compared with the first sensing voltages according to the polarity of the pixel voltages as shown in FIG. 7.

Referring to FIG. 5, FIG. 6 and FIG. 8, in the present embodiment, the control unit 400 causes the driving module 200 to provide the pixel voltages to the pixel electrodes 122 during the display driving period T1, and respectively provide the sensing voltages to the first electrodes 132 by turns during the touch sensing period T2 as shown in FIG. 8. The pixel electrodes 122 are coupled to the first electrodes 132 during the touch sensing period T2. The control unit 400 further causes the sensing module 300 to receive the signals from the second electrodes 152 during the touch sensing period T2. In the present embodiment, the control unit 400 causes the driving module 200 to provide a reference voltage to the common electrode 140 constantly.

Referring to FIG. 3, FIG. 6 and FIG. 9, in the present embodiment, the touch display panel 100 adopts the pixel matrix in FIG. 3, which means the pixel matrix of the touch display panel 100 further includes the second vias 134 as shown in FIG. 3. The second vias 134 are disposed between the first electrodes 132 and the common electrode 140 for electrically connecting the first electrodes 132 to the common electrode 140, respectively. Thereby, the control unit 400 causes the driving module 200 to provide the pixel voltages to the pixel electrodes 122 during the display driving period T1, and provide the sensing voltages to both the first electrodes 132 and the common electrode 140 during the touch sensing period T2 as shown in FIG. 9.

Referring to FIG. 4, FIG. 6 and FIG. 10, in the present embodiment, the touch display panel 100 adopts the pixel matrix in FIG. 4, which means each of the pixel electrodes 122 of the touch display device 10 includes the first pixel electrode 122a and the second pixel electrode 122b shown in FIG. 4. The control unit 400 causes the driving module 200 to provide the sensing voltage to the first electrodes 132 during the touch sensing period T2. The control unit 400 further causes the driving module 200 to provide a first voltage to the first pixel electrode 122a during the display driving period T1, and provide a second voltage to the second pixel electrode 122b, wherein the second voltage is the same as the sensing voltages provided to the first electrodes 132, and the first voltage is different from the second voltage. In the present embodiment, the first voltage is opposite in polarity and same in absolute value as compared with the second voltage, but the invention is not limited thereto. The first pixel electrode 122a is coupled to the second pixel electrode 122b and the first electrodes 132. Also, the control unit 400 causes the driving module 200 to provide a reference voltage to the common electrode 140 during the display driving period T1, and to stop providing the reference voltage to the common electrode 140 during the touch sensing period. However, in other embodiment, the control unit 400 may cause the driving module 200 to provide a reference voltage to the common electrode 140 constantly.

In sum, the first electrodes of the invention are configured to separate any two adjacent pixel electrodes from each other, such that the first electrodes shield the pixel electrodes from each other to reduce the coupling effect therebetween during the display driving period. In addition, a plurality of sensing voltages are provided to the first electrodes during the touch sensing period and causes the sensing module to receive the signals from the second electrodes disposed on the top surface of the second substrate. Thereby, the first electrodes deemed as the touch sensing electrodes are built in the pixel matrix of the invention, which effectively reduces overall thickness of the touch display device. Moreover, since the signal interference between the pixel electrodes are shielded by the first electrodes, the required gap between any two adjacent pixel electrodes are also reduced, such that the touch display panel can have high aperture ratio and provide better display quality. Furthermore, the common electrode can shield the first electrodes from the scan lines and the data lines to reduce the signal interference during the touch sensing period, so as to improve the touch sensibility.

It will be apparent to those skilled in the art that various modifications and variations can be made to the structure of the disclosed embodiments without departing from the scope or spirit of the invention. In view of the foregoing, it is intended that the disclosed embodiments cover modifications and variations of this invention provided they fall within the scope of the following claims and their equivalents.

What is claimed is:

1. A pixel matrix, comprising:
a first substrate;
a plurality of pixel structures, comprising a plurality of pixel electrodes and disposed on the first substrate in an array arrangement;
a first electrode set, comprising a plurality of first electrodes, the first electrodes arranged along a first direction on the first substrate, each of the first electrodes having a plurality of first openings arranged corresponding to the pixel electrodes and surrounding the corresponding pixel electrodes;
a common electrode, disposed between the first electrodes and the first substrate and between the pixel electrode and the first substrate, wherein a sensing voltage is provided to the common electrode during a touch sensing period; and
a plurality of auxiliary vias, disposed between the first electrodes and the common electrode for electrically connecting the first electrodes to the common electrode respectively.

2. The pixel matrix as claimed in claim 1, wherein the pixel structures further comprises a plurality of active devices, the active devices are in an off state during the touch sensing period.

3. The pixel matrix as claimed in claim 2, wherein the pixel structures further comprising a plurality of scan lines and a plurality of data lines, each of the active devices is coupled to one of the scan lines and one of the data lines, the scan lines and the data lines and are disposed on the first substrate, each of the data lines crosses over the scan lines, the common electrode comprises a plurality of second openings and each of the pixel electrodes are electrically connected to the corresponding data line through a first via penetrating through the corresponding second opening.

4. The pixel matrix as claimed in claim 1, wherein a plurality of sensing voltages are respectively provided to the first electrodes by turns.

5. A pixel matrix, comprising:
a first substrate;
a plurality of pixel structures, comprising a plurality of pixel electrodes and disposed on the first substrate in an array arrangement;
a first electrode set, comprising a plurality of first electrodes, the first electrodes arranged along a first direction on the first substrate, each of the first electrodes having a plurality of first openings arranged corresponding to the pixel electrodes and surrounding the corresponding pixel electrodes; and
a common electrode, disposed between the first electrodes and the first substrate and between the pixel electrode and the first substrate, wherein a reference voltage is provided to the common electrode during a touch sensing period,
wherein a plurality of sensing voltages are respectively provided to the first electrodes by turns,
wherein each of the pixel electrodes comprises a first pixel electrode and a second pixel electrode, a first voltage is provided to the first pixel electrode during a display driving period, and a second voltage is provided to the second pixel electrode, the second voltage are the same as the sensing voltages, and the first voltage is different from the second voltage.

6. The pixel matrix as claimed in claim 5, wherein a reference voltage is provided to the common electrode during a display driving period.

7. A touch display device, comprising:
a touch display panel, comprising:
a first substrate;
a plurality of pixel structures, disposed on the first substrate in an array arrangement, each of the pixel structures comprising a pixel electrode;
a first electrode set, comprising a plurality of first electrodes arranged along a first direction on the first substrate, the first electrodes configured to separate any two adjacent pixel electrodes from each other;

a common electrode, disposed between the first electrodes and the first substrate;

a second substrate, disposed opposite to the first substrate and having a top surface and a bottom surface opposite to the top surface, the bottom surface facing the first substrate;

a second electrode set, comprising a plurality of second electrodes disposed on the top surface of the second substrate and arranged along a second direction intersected with the first direction; and a display medium, sandwiched between the first substrate and the second substrate;

a driving module, coupled to the touch display panel and configured to provide a plurality of pixel voltages to the pixel electrodes during a display driving period in a frame period, and provide a plurality of sensing voltages to the first electrode set during a touch sensing period in the frame period;

a sensing module, coupled to the touch display panel to receive signals from the other one of the first electrode set and second electrode set;

a control unit, coupled to the driving module and the sensing module, wherein the control unit causes the driving module to respectively provide a plurality of first sensing voltages to the first electrodes by turns during a first touch sensing period in a first frame period and respectively provides a plurality of second sensing voltages to the first electrodes by turns during a second touch sensing period in a second frame period next to the first frame period, the second sensing voltages are opposite in polarity and same in absolute value as compared with the first sensing voltages according to the polarity of the pixel voltages; and a plurality of auxiliary vias, disposed between the first electrodes and the common electrode for electrically connecting the first electrodes to the common electrode, respectively.

8. The touch display device as claimed in claim 7, wherein the control unit causes the driving module to provide a sensing voltage to the common electrode.

9. The touch display device as claimed in claim 7, wherein the control unit causes the sensing module to receive signals from the second electrodes during the touch sensing period.

10. The touch display device as claimed in claim 7, wherein the pixel structures further comprises a plurality of active devices for receiving the pixel voltages, the active devices are in an off state disconnecting from the pixel voltages during the touch sensing period, and the common electrode disposed between the first electrodes and the active devices.

11. The touch display device as claimed in claim 10, wherein the touch display panel further comprises a plurality of data lines and a plurality of scan lines, wherein each of the active devices is coupled to one of the data lines and one of the scan lines, the data lines and the scan lines are disposed on the first substrate, each of the data lines crosses over the scan lines, the common electrode comprises a plurality of second openings and each of the pixel electrodes are electrically connected to the corresponding data line through a first via penetrating through the corresponding second opening.

12. A touch display device, comprising:
a touch display panel, comprising:
a first substrate;
a plurality of pixel structures, disposed on the first substrate in an array arrangement, each of the pixel structures comprising a pixel electrode;
a first electrode set, comprising a plurality of first electrodes arranged along a first direction on the first substrate, the first electrodes configured to separate any two adjacent pixel electrodes from each other;

a common electrode, disposed between the first electrodes and the first substrate;

a second substrate, disposed opposite to the first substrate and having a top surface and a bottom surface opposite to the to surface, the bottom surface facing the first substrate;

a second electrode set, comprising a plurality of second electrodes disposed on the top surface of the second substrate and arranged along a second direction intersected with the first direction; and a display medium, sandwiched between the first substrate and the second substrate;

a driving module, coupled to the touch display panel and configured to provide a plurality of pixel voltages to the pixel electrodes during a display driving period in a frame period, and provide a plurality of sensing voltages to one of the first electrode set and the second electrode set during a touch sensing period in the frame period;

a sensing module, coupled to the touch display panel to receive signals from the other one of the first electrode set and second electrode set; and a control unit, coupled to the driving module and the sensing module, wherein the control unit causes the driving module to respectively provide a plurality of first sensing voltages to the first electrodes by turns during a first touch sensing period in a first frame period and respectively provides a plurality of second sensing voltages to the first electrodes by turns during a second touch sensing period in a second frame period next to the first frame period, the second sensing voltages are opposite in polarity and same in absolute value as compared with the first sensing voltages according to the polarity of the pixel voltages, wherein the control unit causes the sensing module to receive signals from the second electrodes during the touch sensing period, and wherein each of the pixel electrodes comprises a first pixel electrode and a second pixel electrode, the driving module provides a first voltage to the first pixel electrode during the display driving period, and provides a second voltage to the second pixel electrode, the second voltage is the same as the sensing voltages, and the first voltage is different from the second voltage.

13. The touch display device as claimed in claim 12, wherein the control unit causes the driving module to provide a reference voltage to the common electrode during the display driving period and to stop providing the reference voltage to the common electrode during the touch sensing period, and the first pixel electrode is coupled to the common electrode during the touch sensing period.

14. A driving method for a touch display panel, comprising:
providing a plurality of pixel voltages to a plurality of pixel electrodes of the touch display panel during a display driving period in a frame period, wherein the touch display panel comprises a first substrate, a second substrate opposite to the first substrate, a first electrode set disposed on the first substrate and a second electrode set disposed on a top surface of the second substrate, the first electrode set configured to separate any two adjacent pixel electrodes from each other, wherein each of the pixel electrodes comprises a first pixel electrode and a second pixel electrode;
driving one of the first electrode set and the second electrode set during a touch sensing period in the frame period, wherein a plurality of sensing voltages are provided to the first electrode set during the touch sensing period, wherein a plurality of first sensing voltages are provided to the first electrode set during a first touch sensing period in a first frame period, and a plurality of second sensing voltages are provided to the first electrode set during a second touch sensing period in a second frame period next to the first frame period, the second sensing voltages are opposite in polarity and same in absolute value as compared with the first sensing voltages according to the polarity of the pixel voltages;

receiving a plurality of sensing signals from the other one of the first electrode set and second electrode set during the touch sensing period;

providing a first voltage to the first pixel electrode during the display driving period; and providing a second voltage to the second pixel electrode during the display driving period, wherein the first voltage is opposite in polarity and same in absolute value as compared with the second voltage, wherein the second voltages are the same as the sensing voltages.

15. The driving method as claimed in claim 14, further comprising:

providing a reference voltage to a common electrode of the touch display panel during the display driving period; and stop providing the reference voltage to the common electrode during the touch sensing period.

16. The driving method as claimed in claim 14, further comprising:

providing a reference voltage to a common electrode of the touch display panel during the frame period.

17. The driving method as claimed in claim 14, wherein the first electrode set is electrically connected to a common electrode of the touch display panel.

18. The driving method as claimed in claim 14, further comprising:

providing a reference voltage to a common electrode of the touch display panel during the display driving period; and stop providing the reference voltage to the common electrode during the touch sensing period, wherein the first pixel electrode is coupled to the common electrode during the touch sensing period.

19. The driving method as claimed in claim 14, wherein the step of driving one of the first electrode set and the second electrode set during the touch sensing period in the frame period comprises:

providing a plurality of sensing voltages to the second electrode set during the touch sensing period.

* * * * *